US012732144B2

(12) United States Patent
Wada et al.

(10) Patent No.: US 12,732,144 B2
(45) Date of Patent: Sep. 8, 2026

(54) MODULATOR

(71) Applicants: DENSO CORPORATION, Kariya-City (JP); TOYOTA JIDOSHA KABUSHIKI KAISHA, Toyota (JP); MIRISE Technologies Corporation, Nisshin (JP)

(72) Inventors: Shotaro Wada, Nisshin (JP); Tomohiro Nezuka, Nisshin (JP); Yoshikazu Furuta, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 517 days.

(21) Appl. No.: 18/472,389

(22) Filed: Sep. 22, 2023

(65) Prior Publication Data

US 2024/0113672 A1 Apr. 4, 2024

(30) Foreign Application Priority Data

Oct. 4, 2022 (JP) ................................ 2022-160327

(51) Int. Cl.
*H03F 3/387* (2006.01)
*H03F 3/45* (2006.01)

(52) U.S. Cl.
CPC ......... *H03F 3/387* (2013.01); *H03F 3/45475* (2013.01); *H03F 2200/129* (2013.01)

(58) Field of Classification Search
CPC ................ H03F 3/387; H03F 3/45475; H03F 2200/129; H03F 2200/156;
(Continued)

(56) References Cited

U.S. PATENT DOCUMENTS

2023/0421170 A1* 12/2023 Wada .................... H03M 3/458

OTHER PUBLICATIONS

Z. Tang, R. Zamparette, Y. Furuta, T. Nezuka and K. A. A. Makinwa, "A ±25A Versatile Shunt-Based Current Sensor with 10kHz Bandwidth and ±0.25% Gain Error from -40° C. to 85° C. Using 2-Current Calibration," 2022 IEEE International Solid-State Circuits Conference (ISSCC), 2022, pp. 66-68. doi: 10.1109/ISSCC42614.2022.9731777.

(Continued)

*Primary Examiner* — Andrea Lindgren Baltzell
*Assistant Examiner* — Nareh Shamiryan
(74) *Attorney, Agent, or Firm* — Posz Law Group, PLC

(57) ABSTRACT

A modulator includes an integrator, an input chopping switch, and output chopping switch, and a control circuit. The integrator has a differential amplifier, a first switch and a series circuit. The first switch is connected between input and output terminals of the differential amplifier. The series circuit is connected between the input and output terminals of the differential amplifier. The series circuit has a second switch, an input capacitance chopping switch, an integration capacitor and an output capacitance chopping switch. The control circuit controls the input chopping switch and the output chopping switch to execute chopping being at a chopping frequency identical to the input capacitance chopping switch and the output capacitance chopping switch. The chopping frequency of the input and output capacitance chopping switches is lower than a switching frequency of the first switch.

5 Claims, 14 Drawing Sheets

(58) Field of Classification Search
CPC ......... H03F 2200/159; H03F 2200/271; H03C 3/02; H03M 3/00; H03M 3/322; H03M 3/422
USPC ........................................................ 330/10, 9
See application file for complete search history.

(56) References Cited

OTHER PUBLICATIONS

Christian C. Enz and Gabor C. Temes, "Circuit Techniques for Reducing the Effects of Op-Amp Imperfections: Autozeroing, Correlated Double Sampling, and Chopper Stabilization," Proceedings of the IEEE, vol. 84, No. 11, Nov. 1996.

* cited by examiner

FIG. 17

21
DAC
24
DAC
13
DAC
25
SECOND ORDER INTEGRATOR
23
12
15
14
Vin
22
Cin1
Cin2
Φ2e
Φ1e
2
CHL1p/m
Cint
3
CHL2p/m
1

FIG. 18

Φ1
Φ2
Φ0
bs
Trim_bs
CHL
CHLD
Trim_in=0.5

MODULATOR

CROSS REFERENCE TO RELATED APPLICATION

This application is based on Japanese Patent Application No. 2022-160327 filed on Oct. 4, 2022, the disclosure of which is incorporated herein by reference.

TECHNICAL FIELD

The present disclosure relates to a modulator.

BACKGROUND

A current sensor may adopt a modulator in which a feedback system is added to an integrator. The modulator may include a differential amplifier, an integration capacitor, and several switches.

SUMMARY

The present disclosure describes a modulator including an integrator, an input chopping switch located at an input of the integrator, an output chopping switch located at an output of the integrator, and a control circuit.

BRIEF DESCRIPTION OF DRAWINGS

FIG. 17 illustrates a structure of a modulator in a third embodiment.

FIG. 18 illustrates a structure of a modulator in the comparative example.

DETAILED DESCRIPTION

Figure 18:
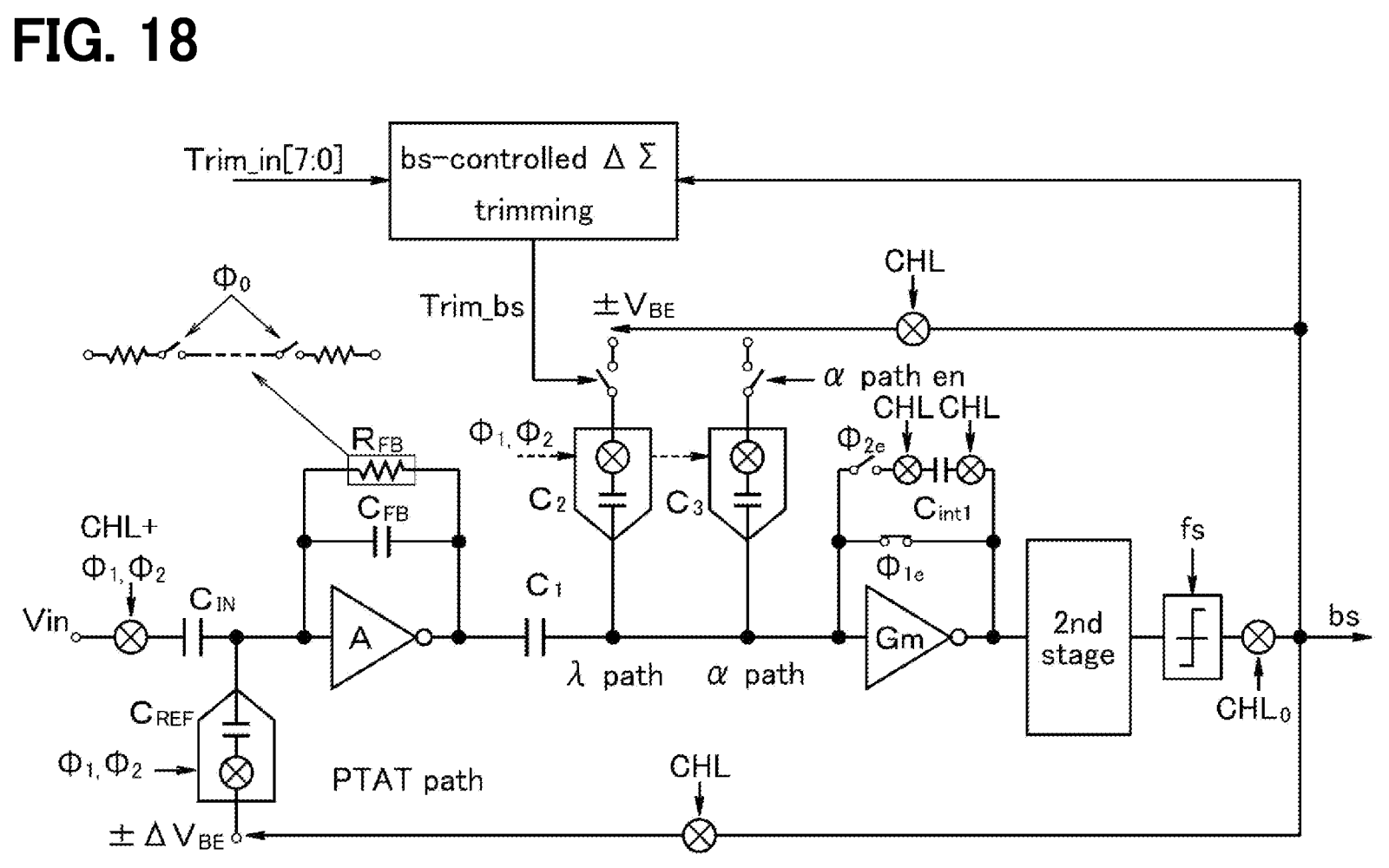
Figure 19:
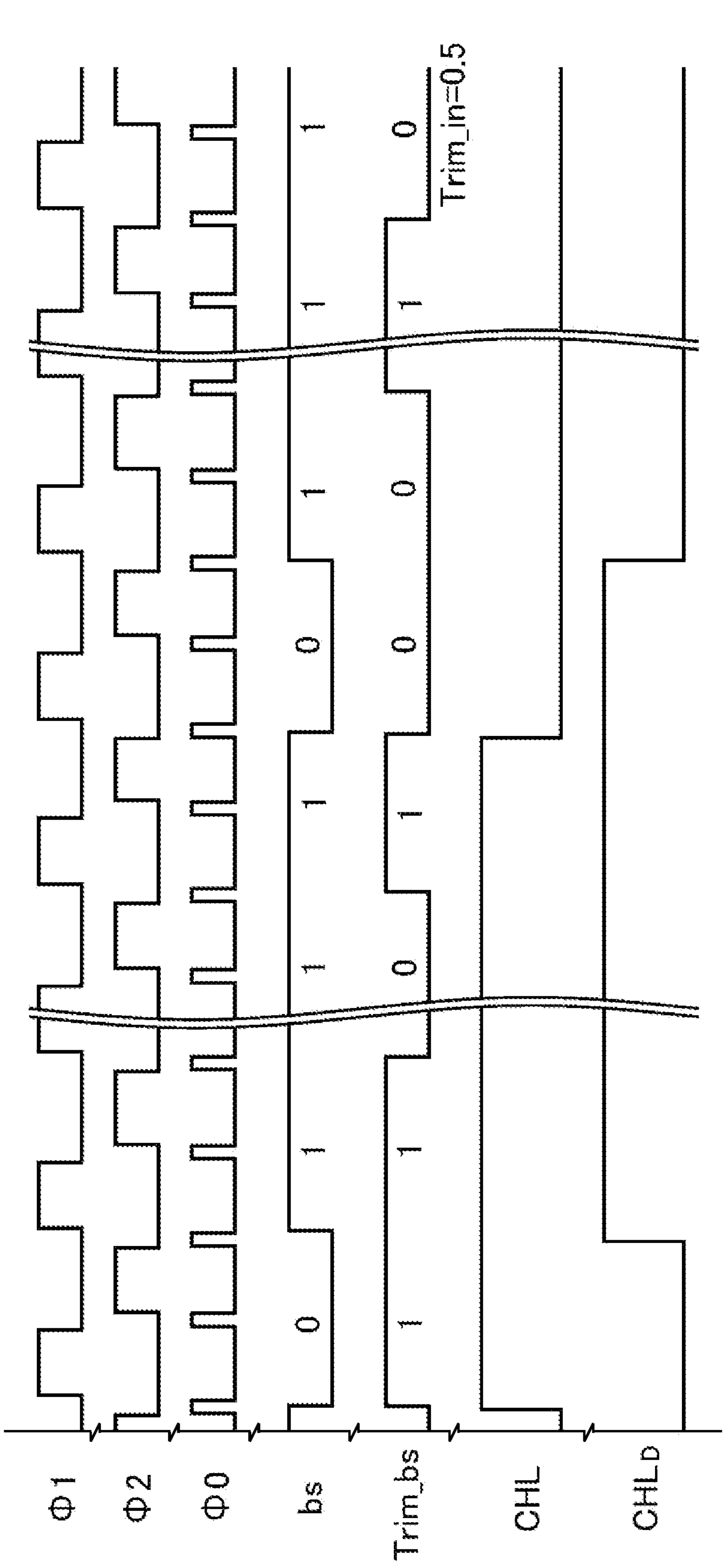
FIG. 19 is a timing chart that illustrates an operation of the modulator in the comparative example.

In order to reduce an offset voltage of a differential amplifier in a comparative current sensor as illustrated in FIGS. 18 and 19, chopping is executed by a switch ϕ2*e* located at an input of the differential amplifier, a switch ϕ1*e* located between an input and the output of the differential amplifier, and a switch CHL connected to both ends of an integrating capacitor Cint1 between the input and the output of the differential amplifier.

Figure 20:
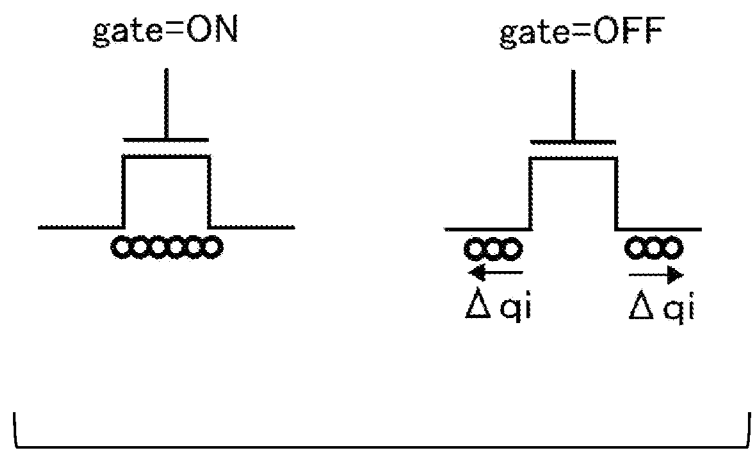
FIG. 20 illustrates a charge injection.

When the switch CHL is switched, chopping is executed without changing the timing pattern of the switch ϕ2*e*. A MOSFET or the like may be generally adopted for a chopping switch. As shown in FIG. 20 as a comparative example, when the MOSFET is turned on, electric charges are charged immediately below the gate terminal. Then, as shown in FIG. 20, when the MOSFET is turned off, the charges charged in the gate are injected into a source terminal and a drain terminal of the MOSFET. This injected charge provides an error Δqi. This phenomenon is defined as a charge injection. The charge injection may be simply referred to as an injection in the present disclosure.

In a situation where the switch ϕ2*e* is turned off earlier than the switch CHL or in a situation where the switch CHL is turned off earlier than the switch ϕ2*e*, if the charges caused by the injection remain at a common connection node between the switch ϕ2*e* and the switch CHL, the charges remained before or after the switching of the switch CHL may cause an error.

According to an aspect of the present disclosure, a modulator includes an integrator, an input chopping switch, an output chopping switch, and a control circuit. The integrator includes a differential amplifier, a first switch, and a series circuit having a second switch, an input capacitance chopping switch for chopping capacitance, an integration capacitor and an output capacitance chopping switch for chopping capacitance. The first switch is connected between an input terminal and an output terminal of the differential amplifier. The series circuit is connected between the input terminal and the output terminal of the differential amplifier. The control circuit sets a potential of a common connection node of the second switch and the input capacitance chopping switch to an initial potential by turning on the first switch and the second switch in a transition period during which an on/off state of each of the input capacitance chopping switch and the output capacitance chopping switch is switched.

In the transition period of each of the input capacitance chopping switch and the output capacitance chopping switch, when the first and second switches are turned on, the potential of the common connection node reaches an initial potential identical to a potential of each of the input terminal and output terminal of the differential amplifier. Since the amount of residual charges caused by the charge injection decreases at the common connection node, it is possible to reduce the error.

Moreover, the input chopping switch is connected to an input side of the integrator, and the output chopping switch is connected to an output side of the integrator. The control circuit controls the input chopping switch and the output chopping switch to execute chopping at a chopping frequency identical to the input capacitance chopping switch and the output capacitance chopping switch. In addition, the chopping frequency of the input capacitance chopping switch and the output capacitance chopping switch to execute chopping is set to be lower than a switching frequency of the first switch. Accordingly, it is possible to reduce an offset voltage of the differential amplifier or an undesirable effect such as a flicker noise.

First Embodiment

Figure 1:
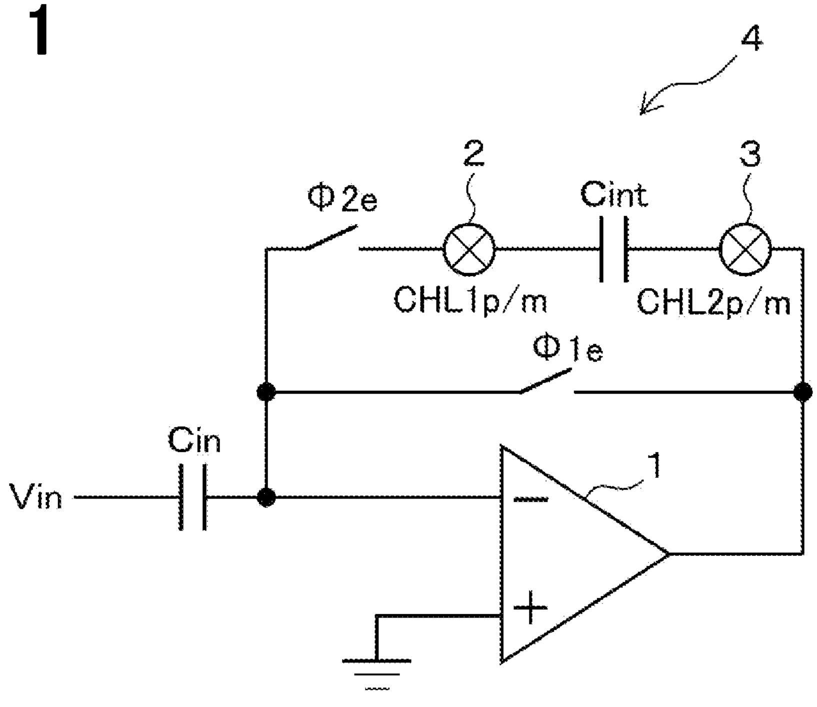
FIG. 1 illustrates a simplified structure of an integrator illustrated in FIG. 3 in a first embodiment (part 1).
Figure 2:
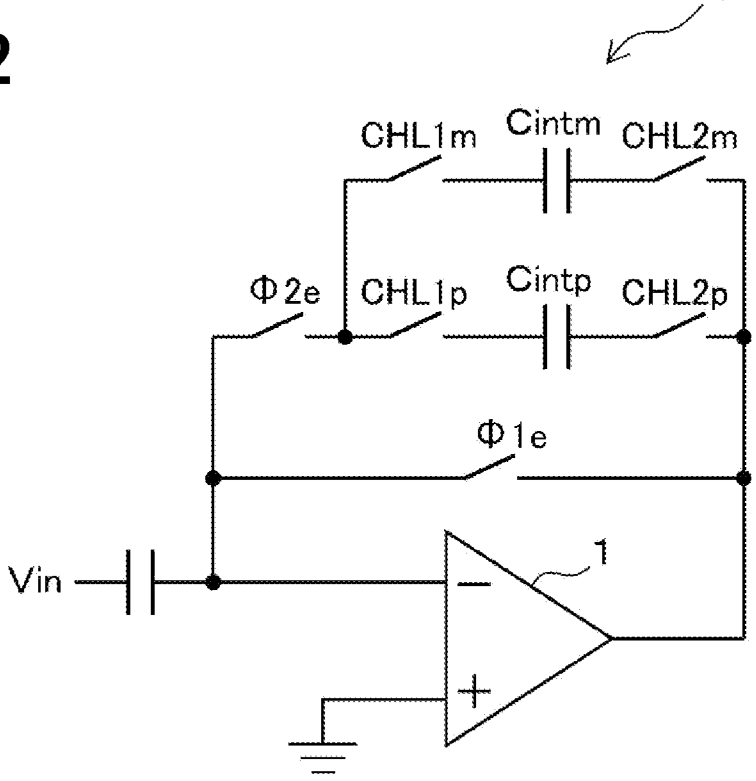
FIG. 2 illustrates a simplified structure of the integrator illustrated in FIG. 3 in the first embodiment (part 2).
Figure 3:
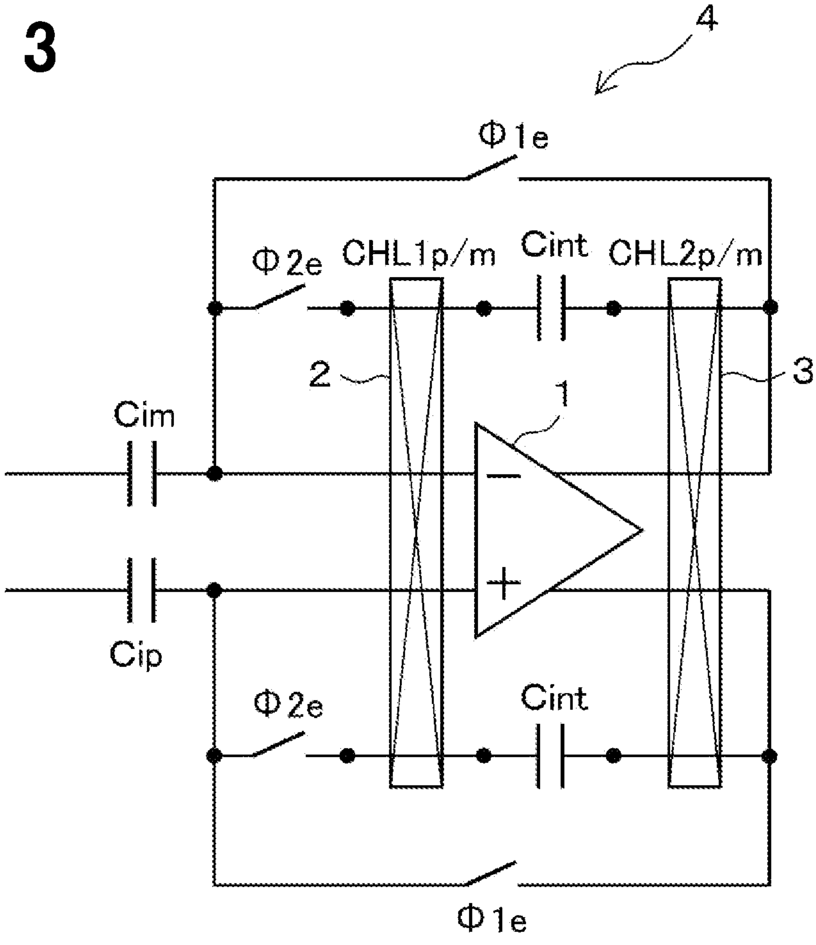
FIG. 3 illustrates a structure of the integrator adopting a differential amplifier as a differential input/output of the integrator.

An amplifier in each of the following embodiments is a differential amplifier as illustrated in FIG. 3. For simpler illustration, FIG. 1 illustrates a single-ended type amplifier that switches and the like at a positive terminal side and a negative terminal side are grouped together; and FIG. 2 illustrates that the identical switches and the like are grouped at a single side. FIG. 3 illustrates that the structure of a differential amplifier 1 at an inverting side and the structure of the differential amplifier 1 at a non-inverting side are symmetrical. In the following, "m" denotes the structure at the inverting side, in other words, the negative terminal side; and "p" denotes the structure at the non-inverting side, in other words, the positive terminal side. In a case where the inverting side and the non-inverting side of the structure are not required to be differentiated, "m" and "p" are omitted.

As illustrated in FIG. 3, each input terminal of the differential amplifier 1 is supplied with an input voltage via a coupling capacitor Cin. A first switch ϕ1*e* is connected between the input terminal and an output terminal of the differential amplifier 1, and a series circuit in which a second switch ϕ2*e*, a system CHOP switch 2, an integration capacitor Cint, and a system CHOP switch 3 are connected in series is connected between the input terminal and the output terminal of the differential amplifier 1.

Figure 4:
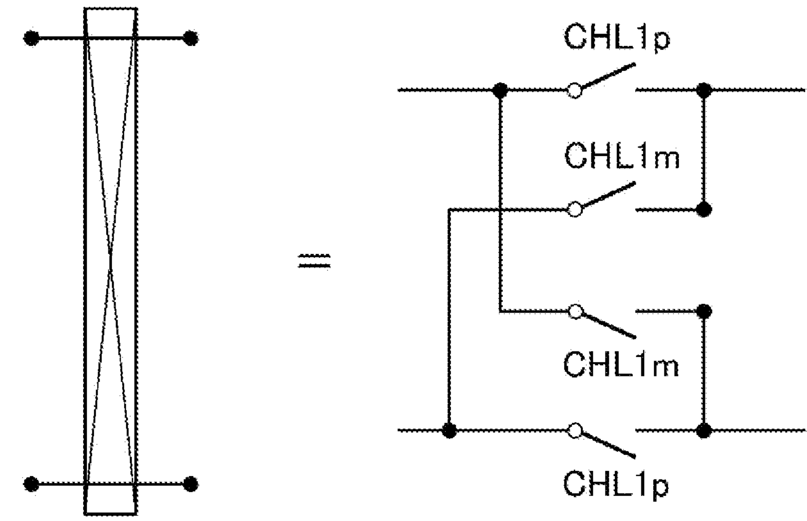
FIG. 4 illustrates correspondence between symbols of a system CHOP switch and a combination of multiple switches.

The system CHOP switch 2 illustrated symbolically in FIG. 3 includes two switches CHL1*p* connected in series respectively to the inverting side and the non-inverting side and two switches CHL1*m* connected in a crossed state between the inverting side and the non-inverting side, as illustrated in FIG. 4. The switch CHL1 corresponds to an input switch for capacitance chopping, and the switch CHL2 corresponds to an output switch for capacitance chopping. The input switch for capacitance chopping may also be referred to as an input capacitance chopping switch, and the output switch for capacitance chopping may also be referred to as an output capacitance chopping switch. The switches are configured by adopting, for example, N-channel MOSFETs.

FIG. 1 illustrates that the system CHOP switch 2 has a group of switches CHL1*p/m* and the system CHOP switch 3 has a group of switches CHL2*p/m*. In FIG. 2, the system CHOP switch 2 is shown as switches CHL1*p* and CHL1*m*; and the system CHOP switch 3 is shown as switches CHL2*p* and CHL2*m*. In the above structure, the integrator 4 includes, for example, the differential amplifier 1, the integration capacitor Cint connected between the input and output terminals of the differential amplifier 1, and the system CHOP switches 2, 3. The integrator 4 is a correlated double sampling (CDS) integrator. The switch CHL1*p* may also be referred to as a positive input capacitance chopping switch. The switch CHL2*p* may also be referred to as a positive output capacitance chopping switch. The switch CHL1*m* may also be referred to as a negative input capacitance chopping switch. The switch CHL2*m* may also be referred to as a negative output capacitance chopping switch.

The following describes an operation in the first embodiment. The structure illustrated in FIG. 18 is also referred to as a comparative structure in a comparative example. In the comparative example, since the timing of switching the system CHOP switches 2, 3 does not take into consideration of switching switches ϕ1*e* and ϕ2*e*, it may be possible that the timing of switching the system CHOP switches 2, 3 and the timing of turning off the switch ϕ2*e* are substantially at the same time.

Figure 5:
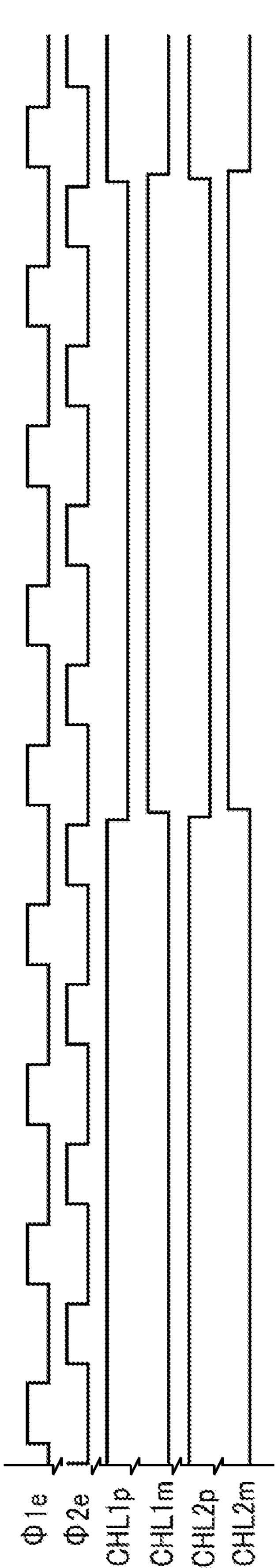
FIG. 5 is a timing chart illustrating an ON/OFF sequence of each switch assumed in a comparative example.
Figure 6:
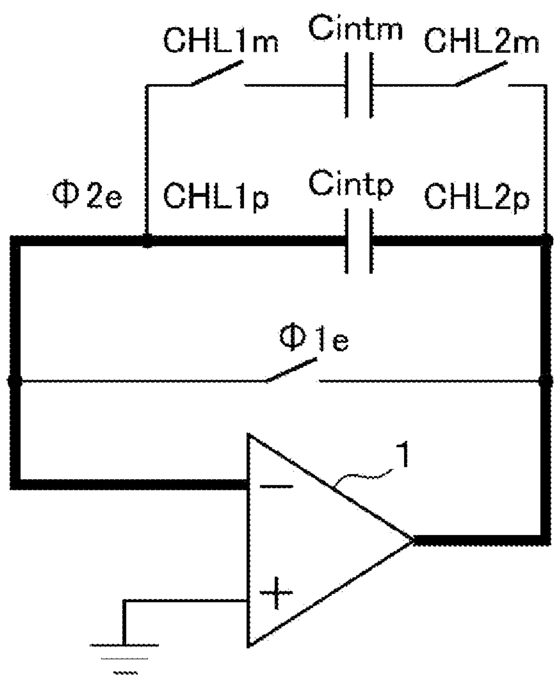
FIG. 6 illustrates a conducting wiring with a thick line in association with the ON/OFF sequence shown in FIG. 5 (part 1).
Figure 7:
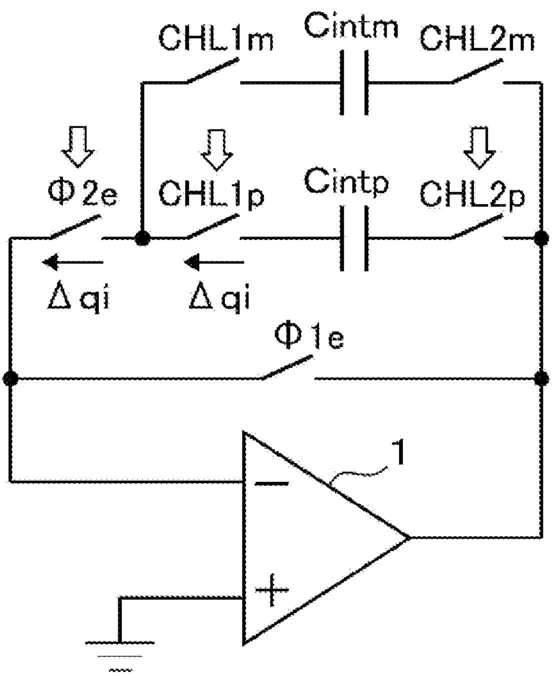
FIG. 7 illustrates wirings not being conducted in association with the ON/OFF sequence shown in FIG. 5 (part 2).
Figure 8:
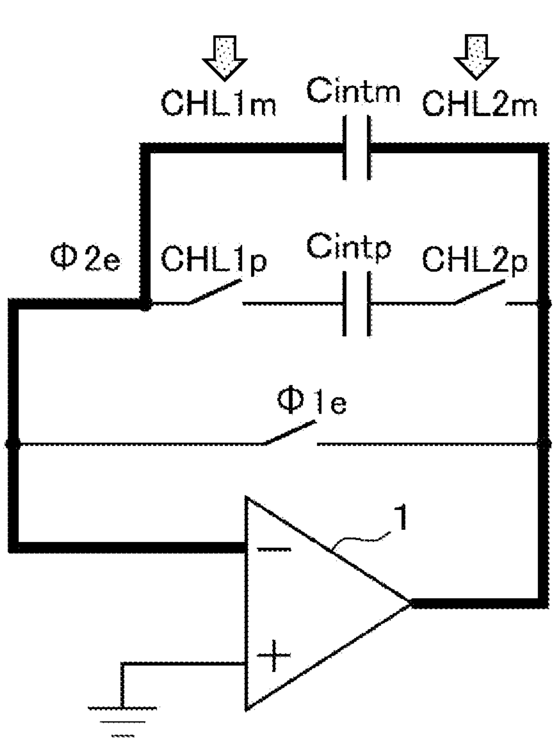
FIG. 8 illustrates a conducting wiring with a thick line in association with the ON/OFF sequence shown in FIG. 5 (part 3).

FIGS. 6 and 8 illustrate a conducting wiring with a thick line in association with an ON/OFF sequence of each switch in FIG. 5 according to the comparative example. FIG. 7 illustrates wirings not being conducted in association with the ON/OFF sequence of each switch in FIG. 5. As shown in FIG. 7, when the switch ϕ2*e* and the switch CHL1*p* are turned off at the same time, an error Δqi due to a charge injection remains at a common connection node of the switch ϕ2*e* and the switch CHL1*p*.

Figure 9:
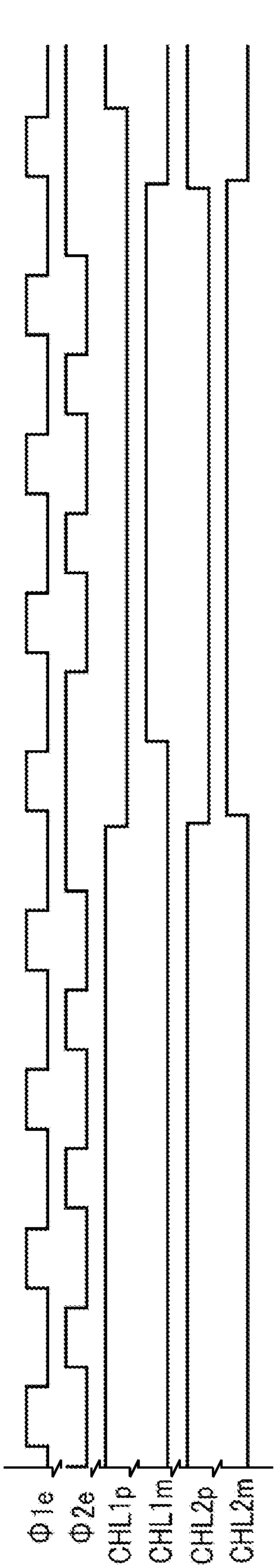
FIG. 9 is a timing chart illustrating an ON/OFF sequence of each switch in a first embodiment.
Figure 10:
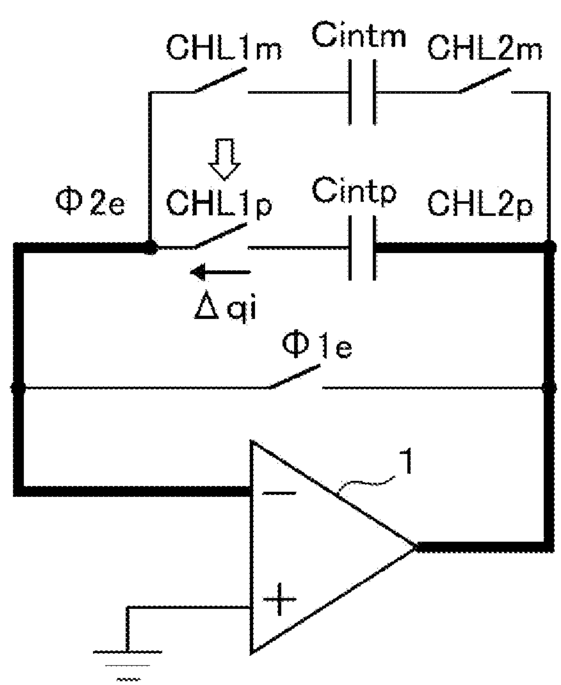
FIG. 10 illustrates a conducting wiring with a thick line in association with the ON/OFF sequence shown in FIG. 9 (part 1).
Figure 11:
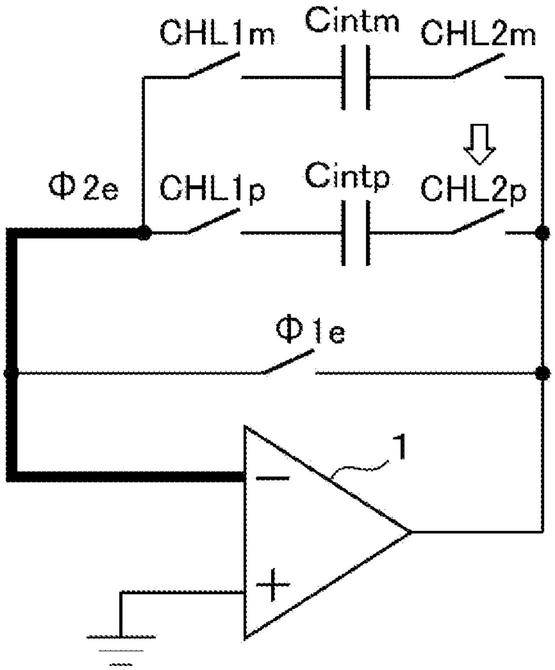
FIG. 11 illustrates a conducting wiring with a thick line in association with the ON/OFF sequence shown in FIG. 9 (part 2).

In contrast, in the first embodiment, an ON/OFF sequence of each switch is modified as illustrated in FIG. 9. A period during which the system CHOP switches 2 and 3 are switched on or off is called a transition period. After an initial state being identical to the comparative example as illustrated in FIG. 6, the second switch ϕ2*e* is turned on before starting the transition period. When the transition period starts, the following first to fourth sequences are processed in a sequential order. In a first sequence, the switch CHL1*p* is initially turned off as illustrated in FIG. 10, and the switch CHL2*p* is subsequently turned off as illustrated in FIG. 11.

Figure 12:
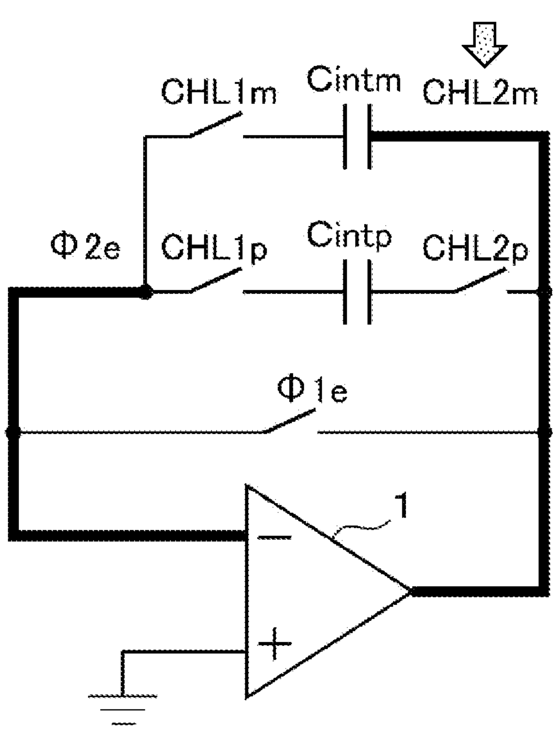
FIG. 12 illustrates a conducting wiring with a thick line corresponding to the ON/OFF sequence shown in FIG. 9 (part 3).
Figure 13:
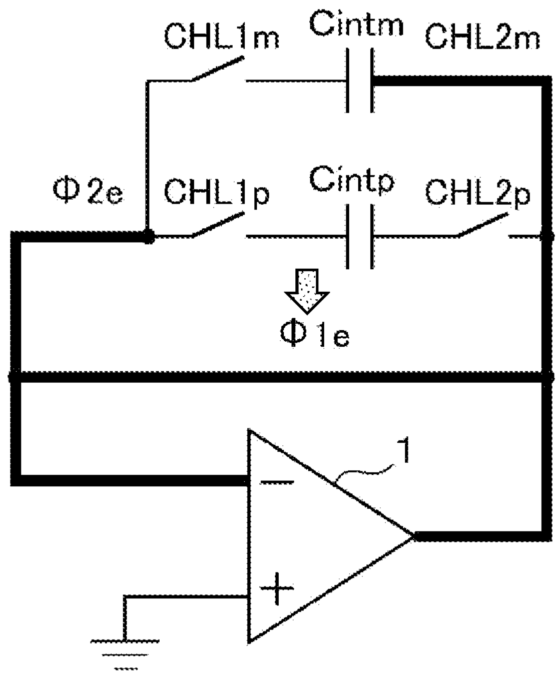
FIG. 13 illustrates a conducting wiring with a thick line in association with the ON/OFF sequence shown in FIG. 9 (part 4).
Figure 14:
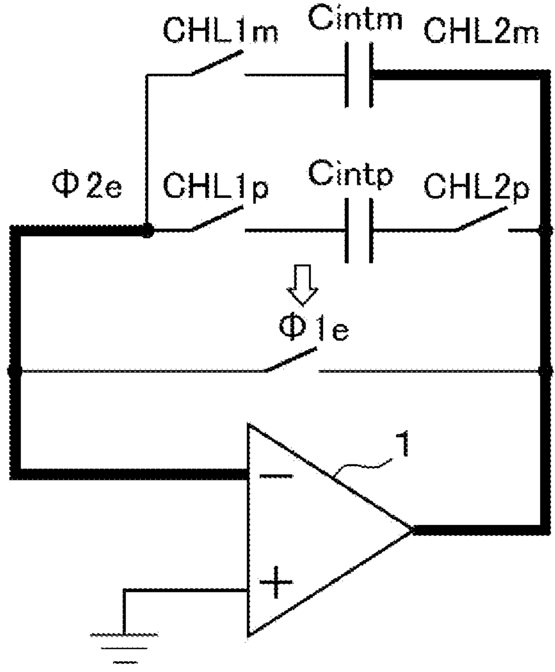
FIG. 14 illustrates a conducting wiring with a thick line in association with the ON/OFF sequence shown in FIG. 9 (part 5).
Figure 15:
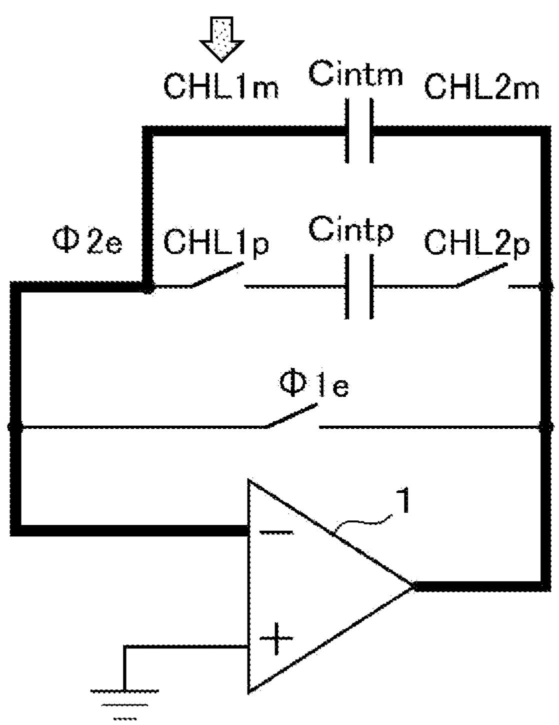
FIG. 15 illustrates a conducting wiring with a thick line in association with the ON/OFF sequence shown in FIG. 9 (part 6).

In the second sequence, the switch CHL2*m* is subsequently turned on as illustrated in FIG. 12. In the third sequence, the switch ϕ1*e* is turned on as illustrated in FIG. 13. As a result, the input/output terminals of the differential amplifier 1 are short-circuited, such that the respective potentials of the terminals reach initial potentials. At this timing, the common connection node of the switch ϕ2*e* and the switch CHL1*p* no longer has residual error Δqi caused by the injection of switch CHL1*p*. After that, the switch ϕ1*e* is turned off as illustrated in FIG. 14, and the switch CHL1*m* is turned on as illustrated in FIG. 15 to terminate a series of the ON/OFF sequence in the fourth sequence. As illustrated in FIG. 5, the frequency for chopping executed by the switches CHL1 and CHL2 is set lower than the frequency for chopping executed by the first switch ϕ1*e*.

According to the present embodiment as described above, the first switch ϕ1*e* is connected between the input terminal and the output terminal of the differential amplifier 1; and a series circuit in which the input capacitance chopping switch CHL1, the integration capacitor Cint, and the output capacitance chopping switch CHL2 are connected in series is connected between the input terminal and the output terminal of the differential amplifier 1. Accordingly, the integrator 4 is constructed as described above. The control circuit sets a potential of the common connection node of the switch ϕ2*e* and the switch CHL1*p* to the initial potential by turning on the first switch ϕ1*e* and the second switch ϕ2*e* in a transition period during which the on/off state of each of the switches CHL1 and CHL2 is switched. Specifically, the ON/OFF sequence of each switch in the transition period is performed according to the above-mentioned first to fourth sequences.

During the transition period, the first switch φ1*e* and the second switch φ2*e* are turned on, so that the potential of the common connection node of the switch φ2*e* and the switch CHL1*p* reaches the initial potential equal to the potential at each of the input terminal and the output terminal of the differential amplifier 1. According to the above circuitry structure, the amount of residual charges due to the charge injection decreases at the common connection node of the switch φ2*e* and the switch CHL1*p*. Therefore, it is possible to reduce the error.

Second Embodiment

Figure 16:
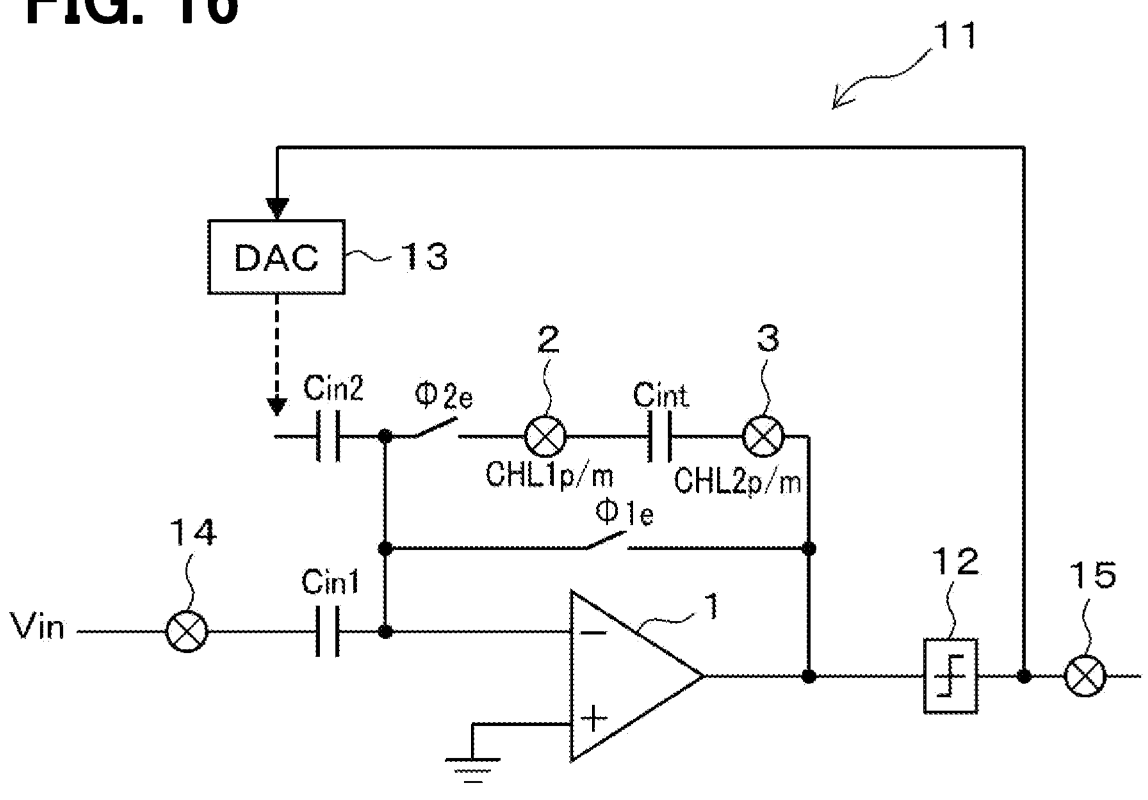
FIG. 16 illustrates a structure of a modulator in a second embodiment.

Hereinafter, the same components as those of the first embodiment are denoted by the same reference numerals, and descriptions of the same components will be omitted, and different portions will be described. As shown in FIG. 16, a modulator 11 according to the second embodiment is constructed by adding a feedback system to the correlated double sampling integrator identical to the one described in the first embodiment. A quantizer 12 is connected to the output terminal of the differential amplifier 1, and a digital-to-analog (D/A) converter 13 is connected to the output terminal of the quantizer 12. The output terminal of the D/A converter 13 is connected to the non-inverting input terminal of the differential amplifier 1 via a switch (not shown) and a capacitor Cin2. The capacitor Cin in the second embodiment may be referred to as a capacitor Cin1. An input chopping switch 14 is connected to the front stage of the capacitor Cin1, and an output chopping switch 15 is connected to the output terminal of the quantizer 12. The input chopping switch 14 and the output chopping switch 15 execute chopping through a control signal having the same frequency as the switches CHL1 and CHL2.

As the modulator 11 is constructed as described above, it is possible to reduce an offset voltage of the differential amplifier 1 or an undesirable effect such as a flicker noise.

Third Embodiment

Figure 17:
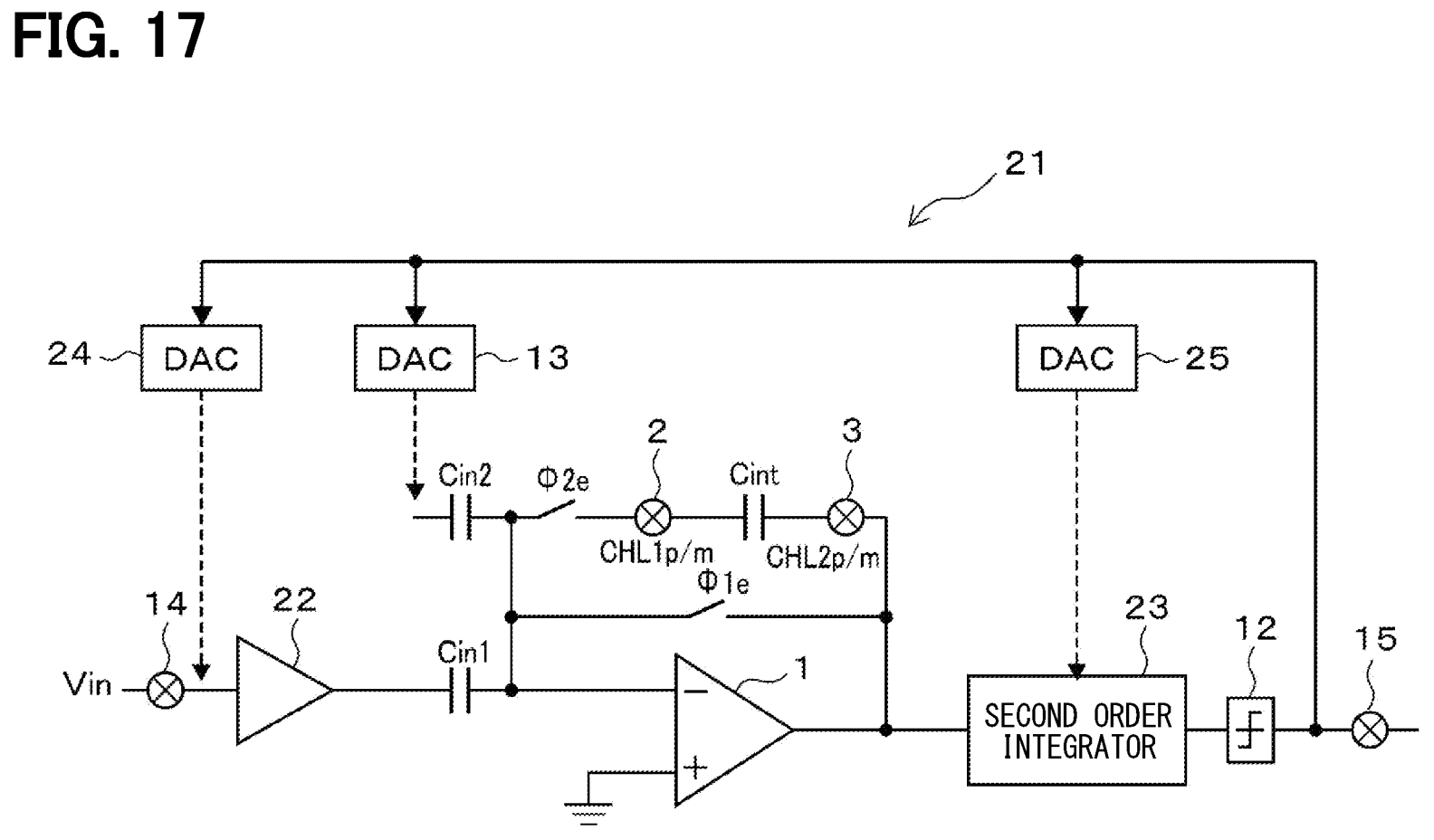

As illustrated in FIG. 17, a modulator 21 according to a third embodiment is constructed by connecting an amplifier 22 between the input chopping switch 14 and the capacitor Cin1 and connecting a second-order integrator 23 between the output terminal of the differential amplifier 1 and the quantizer 12 in the modulator 11 according to the second embodiment. An analog signal is provided through D/A converters 24, 25, as similar to the D/A converter 13, to the input terminal of the amplifier 22 and a capacitor (not shown) of the second-order integrator 23. The D/A converters 24, 25 execute D/A conversion of the output signal of the quantizer 12. The modulator 11 according to the second embodiment corresponds to a first integrator, and the second-order integrator 23 corresponds to a second integrator. When the modulator 21 is constructed as described above, it is possible to shift a quantization noise to a higher frequency region to remove the influence of the quantization noise.

Other Embodiments

The switches may not be limited to N-channel MOSFETs, and may include other semiconductor elements. The amplifier 22 may be omitted in the third embodiment. Also, in the third embodiment, the second-order integrator 23 may be omitted. Although the present disclosure has been described in accordance with the embodiments, it is understood that the present disclosure is not limited to such embodiments and structures. The present disclosure encompasses various modifications and variations within the scope of equivalents. Furthermore, various combination and formation, and other combination and formation including one, more than one or less than one element may be made in the present disclosure.

What is claimed is:

1. A modulator comprising:

an integrator including
- a differential amplifier,
- a first switch connected between an input terminal and an output terminal of the differential amplifier, and
- a series circuit having a second switch, an input capacitance chopping switch for chopping capacitance, an integration capacitor, and an output capacitance chopping switch for chopping capacitance, the series circuit being connected between the input terminal and the output terminal of the differential amplifier;

an input chopping switch connected to an input side of the integrator;

an output chopping switch connected to an output side of the integrator; and a control circuit configured to control the input chopping switch and the output chopping switch to execute chopping at a chopping frequency identical to the input capacitance chopping switch and the output capacitance chopping switch, wherein the chopping frequency of the input capacitance chopping switch and the output capacitance chopping switch is set to be lower than a switching frequency of the first switch, and the control circuit is further configured to set a potential of a common connection node of the second switch and the input capacitance chopping switch to an initial potential by turning on the first switch and the second switch in a transition period during which each of the input capacitance chopping switch and the output capacitance chopping switch is turned on or off.

2. The modulator according to claim 1, wherein the input capacitance chopping switch includes:
- a positive input capacitance chopping switch located at a positive terminal side of the differential amplifier, and
- a negative input capacitance chopping switch located at a negative terminal side of the differential amplifier, the output capacitance chopping switch includes:
- a positive output capacitance chopping switch located at the positive terminal side of the differential amplifier, and
- a negative output capacitance chopping switch located at the negative terminal side of the differential amplifier, the control circuit is further configured to maintain the second switch being turned on in the transition period while sequentially executing a first sequence, a second sequence, a third sequence, and a fourth sequence after an initial state in the transition period, the initial state is a state in which the positive input capacitance chopping switch and the positive output capacitance chopping switch are being turned on and the negative input capacitance chopping switch and the negative output capacitance chopping switch are being turned off, and the control circuit is further configured to:

turn off the positive input capacitance chopping switch and the positive output capacitance chopping switch in the first sequence;

turn on the negative output capacitance chopping switch in the second sequence;

turn on the first switch and then turn off the first switch in the third sequence; and turn on the negative input capacitance chopping switch in the fourth sequence.

3. The modulator according to claim 1, wherein the integrator is a correlated double sampling integrator.

4. The modulator according to claim 3, wherein the integrator is a first integrator, the modulator further comprising:

a second integrator connected after the first integrator.

5. The modulator according to claim 4, further comprising:

an amplifier connected before the first integrator, and configured to amplify an input signal.

* * * * *